United States Patent
Wu et al.

(10) Patent No.: US 11,575,113 B2
(45) Date of Patent: Feb. 7, 2023

(54) DISPLAY PANEL AND MANUFACTURING METHOD THEREFOR, DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiaoping Wu, Beijing (CN); Chuan Li, Beijing (CN); Bo Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/135,501

(22) Filed: Dec. 28, 2020

(65) Prior Publication Data

US 2021/0119186 A1   Apr. 22, 2021

Related U.S. Application Data

(63) Continuation-in-part of application No. 16/638,609, filed as application No. PCT/CN2018/112999 on Oct. 31, 2018.

(30) Foreign Application Priority Data

Nov. 15, 2017   (CN) .......................... 201711131958.4

(51) Int. Cl.
*H01L 51/56*   (2006.01)
*H01L 27/32*   (2006.01)
(Continued)

(52) U.S. Cl.
CPC .......... *H01L 51/56* (2013.01); *B23K 26/0624* (2015.10); *B23K 26/364* (2015.10);
(Continued)

(58) Field of Classification Search
CPC . H01L 51/56; H01L 27/3276; H01L 51/0097; H01L 2251/5338;
(Continued)

(56) References Cited

U.S. PATENT DOCUMENTS

2013/0193617 A1   8/2013   Zhang
2016/0338204 A1   11/2016   McMullen et al.
(Continued)

FOREIGN PATENT DOCUMENTS

CN   101093333 A   12/2007
CN   102789072 A   11/2012
(Continued)

OTHER PUBLICATIONS

First Chinese Office Action issued in corresponding Chinese Patent Application No. 201711131958.4, dated Dec. 3, 2018, with English language translation.
(Continued)

*Primary Examiner* — Kyoung Lee
(74) *Attorney, Agent, or Firm* — Dority & Manning, P.A.

(57) ABSTRACT

A display panel includes a base, a plurality of conductive connectors disposed on the base, a plurality of leads arranged on the base along an edge of the display panel, and at least one groove located between the conductive connectors and the edge. One end of each lead is connected to a corresponding conductive connector, and another end thereof extends to the edge of the display panel. At least one lead is divided into at least two parts by the at least one groove, and a depth of the groove is greater than or equal to a thickness of the lead.

20 Claims, 13 Drawing Sheets

(51) Int. Cl.

| | |
|---|---|
| *G02F 1/1333* | (2006.01) |
| *G02F 1/1345* | (2006.01) |
| *B23K 26/364* | (2014.01) |
| *B23K 26/0622* | (2014.01) |
| *B23K 26/38* | (2014.01) |
| *H01L 51/00* | (2006.01) |
| *B23K 101/36* | (2006.01) |

(52) U.S. Cl.
CPC .... *G02F 1/13458* (2013.01); *G02F 1/133351* (2013.01); *H01L 27/3276* (2013.01); *B23K 26/38* (2013.01); *B23K 2101/36* (2018.08); *G02F 1/133305* (2013.01); *H01L 51/0097* (2013.01); *H01L 2251/5338* (2013.01); *H01L 2251/566* (2013.01)

(58) Field of Classification Search
CPC .......... H01L 2251/566; B23K 26/0624; B23K 26/364; B23K 26/38; B23K 2101/36; G02F 1/133351; G02F 1/13458; G02F 1/133305; G02F 1/1345
See application file for complete search history.

(56) References Cited

U.S. PATENT DOCUMENTS

| | | | |
|---|---|---|---|
| 2018/0203267 A1* | 7/2018 | Wang | ............... G02F 1/133512 |
| 2019/0144325 A1 | 5/2019 | Bowden et al. | |
| 2020/0171606 A1 | 6/2020 | Wu et al. | |

FOREIGN PATENT DOCUMENTS

| | | |
|---|---|---|
| CN | 106914707 A | 7/2017 |
| CN | 107331294 A | 11/2017 |
| CN | 107855665 A | 3/2018 |
| CN | 101435923 A | 5/2019 |
| JP | H20232991 | 9/1990 |

OTHER PUBLICATIONS

PCT International Search Report and Written Opinion (w/ English translation) for corresponding PCT Application No. PCT/CN2018/112999, dated Jan. 30, 2019, 16 pages.

Non-final Office Action for corresponding U.S. Appl. No. 16/638,609, dated Mar. 16, 2022, 16 pages.

\* cited by examiner

DISPLAY PANEL AND MANUFACTURING METHOD THEREFOR, DISPLAY DEVICE

CROSS-REFERENCE TO RELATED APPLICATIONS

This application is a Continuation-in-Part Application of Ser. No. 16/638,609 filed Feb. 12, 2020, which is a national phase entry under 35 USC 371 of International Patent Application No. PCT/CN2018/112999, filed on Oct. 31, 2018, which, in turn, claims priority to Chinese Patent Application No. 201711131958.4 filed Nov. 15, 2017, which are incorporated herein by reference in their entirety.

TECHNICAL FIELD

The present disclosure relates to the field of display technologies, and in particular, to a display panel and a manufacturing method therefor, and a display device.

BACKGROUND

In a process of manufacturing a single display panel, a display motherboard (or referred to as a large board) is first manufactured. Then, the display motherboard is cut into a plurality of separate display panels through a cutting process.

SUMMARY

In an aspect, a display panel is provided. The display panel includes a base, a plurality of conductive connectors disposed on the base, a plurality of leads arranged on the base along an edge of the display panel, and at least one groove located between the conductive connectors and the edge of the display panel. One end of each lead is connected to a corresponding conductive connector, and another end of the lead extends to the edge of the display panel. At least one lead is divided into at least two parts by the at least one groove, and a depth of the at least one groove is greater than or equal to a thickness of the lead.

In some embodiments, an extending direction of a groove closest to the edge of the display panel in the at least one groove is substantially parallel to the edge of the display panel, and a minimum distance between the groove closest to the edge of the display panel and the edge of the display panel is greater than or equal to 30 μm and is less than 200 μm.

In some embodiments, the minimum distance between the groove closest to the edge of the display panel and the edge of the display panel is approximately 63.4 μm.

In some embodiments, the at least one groove includes at least two grooves, extending directions of any two adjacent grooves are substantially parallel to each other, and a minimum distance between two adjacent side walls of the two adjacent grooves is greater than or equal to 30 μm and is less than 200 μm.

In some embodiments, a width of each groove in a direction perpendicular to an extending direction of the groove is less than 25 μm and is greater than 0 μm.

In some embodiments, the width of the groove is approximately 18.2 μm.

In some embodiments, an edge of each conductive connector proximate to the edge of the display panel is substantially parallel to the edge of the display panel, and a minimum distance between the edge of the conductive connector proximate to the edge of the display panel and the edge of the display panel ranges from 100 μm to 200 μm.

In some embodiments, the minimum distance between the edge of the conductive connector proximate to the edge of the display panel and the edge of the display panel is approximately 166.3 μm.

In some embodiments, the display panel further includes a base layer disposed between the base and all the lead and the conductive connectors. The depth of the groove is less than a sum of the thickness of the lead and a thickness of the base layer.

In some embodiments, extending directions of the plurality of leads are substantially parallel to each other, and are substantially perpendicular to the edge of the display panel.

In some embodiments, in the plurality of leads, extending lines of leads closer to a central axis of the display panel are substantially parallel to each other; extending lines of leads farther away from the central axis intersect, and a point where an extension line of each lead away from the central axis intersects with the central axis is located on a side of the edge of the display panel away from the display panel; and the central axis intersects with the edge of the display panel.

In some embodiments, the display panel is a flexible display panel.

In some embodiments, the conductive connectors include bonding electrodes for bonding a circuit structure and/or detection terminals for electrical detection.

In some embodiments, thicknesses of the leads range from 1 μm to 2 μm.

In another aspect, a display device is provided. The display device includes the above display panel.

In yet another aspect, a method for manufacturing a display panel is provided. The method includes: cutting a display motherboard by using a first laser beam to form an original display panel, wherein the original display panel includes a base, a plurality of conductive connectors formed on the base, and a plurality of leads formed on the base along an edge of the original display pane, one end of each lead is connected to a corresponding conductive connector, and another end of the lead extends to the edge of the original display panel; and cutting a portion of the original display panel between the conductive connectors and the edge of the original display panel by using a second laser beam to form at least one groove, wherein at least one lead is divided into at least two parts by the at least one groove, and a depth of the groove is greater than or equal to a thickness of the lead; each groove is formed after being cut at least once by using the second laser beam.

In some embodiments, energy of the second laser beam is less than energy of the first laser beam.

In some embodiments, the second laser beam is a pulsed laser beam.

In some embodiments, the pulsed laser beam is a picosecond green laser beam or a picosecond ultraviolet laser beam.

In some embodiments, the at least one groove is formed after being cut twice by using the picosecond green laser beam, a power of the picosecond green laser beam ranges from 1.5 W to 3.5 W, and a cutting speed ranges from 1200 mm/s to 1800 mm/s.

BRIEF DESCRIPTION OF THE DRAWINGS

In order to describe technical solutions in embodiments of the present disclosure more clearly, the accompanying drawings to be used in the description of the embodiments will be introduced below briefly. However, the accompanying draw

DETAILED DESCRIPTION

Technical solutions in embodiments of the present disclosure will be described below clearly and completely with reference to the accompanying drawings in the embodiments of the present disclosure. Obviously, the described embodiments are merely some but not all of embodiments of the present disclosure. All other embodiments obtained on a basis of the embodiments of the present disclosure by a person of ordinary skill in the art without paying any creative effort shall be included in the protection scope of the present disclosure.

It will be noted that, unless otherwise defined, all terms (including technical and scientific terms) used in some embodiments of the present disclosure have a same meaning as commonly understood by a person of ordinary skill in the art to which some embodiments of the present disclosure belong. It will also be understood that, the terms such as those defined in an ordinary dictionary should be interpreted as having meanings consistent with their meanings in the context of the related art, and should not be interpreted in an idealized or extremely formalized way unless explicitly defined herein.

For example, the terms such as "first", "second" and similar terms used in the description and the claims of some embodiments of the present disclosure are not intended to denote any order, quantity or importance, and are merely used to distinguish different components. The word "comprise" or the like means that an element or item appearing before the word covers an element or item appearing after the word and its equivalent, without excluding other elements or items. Orientations or positional relationships indicated by the terms such as "up/above" and "down/below/under" are based on the orientations or positional relationships shown in the accompanying drawings, and are merely for convenience of description of the technical solutions in the present disclosure, and are not intended to indicate or imply that a referred device or component must have a particular orientation, and must be constructed and operated in a particular orientation. Therefore, they cannot be construed as limitations to the present disclosure.

The phrase "A and/or B" includes the following three combinations: only A, only B, and a combination of A and B.

The term "substantially" or "approximately" includes the stated value and the average value that is within an acceptable deviation range of a specific value. The acceptable deviation range is determined by a person of ordinary skill in the art in view of measurement in question and errors associated with measurement of a specific parameter (i.e., limitations of a measurement system).

Figure 1:
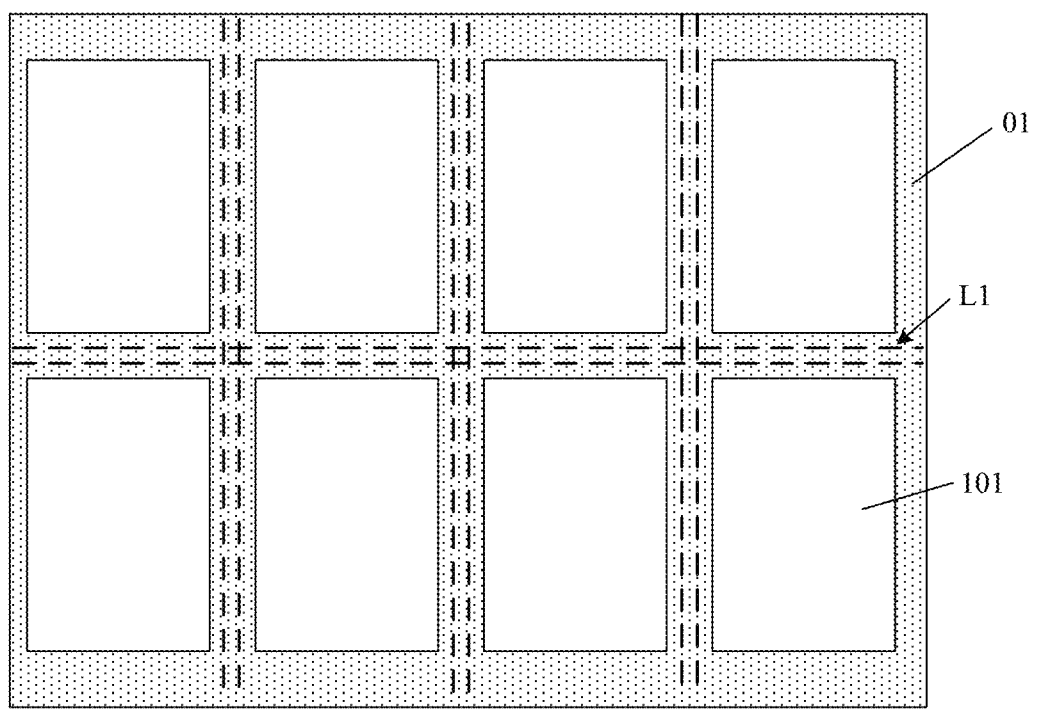
- FIG. 1 is a schematic top view of a display motherboard, in accordance with some embodiments.

As shown in FIG. 1, a display motherboard 01 has a plurality of original display panels 101 to be cut. Before the display motherboard 01 is cut, in order to detect electrical performances of the display motherboard 01 manufactured by means of industrial mass production, as shown in FIGS. 2A and 2B, a plurality of conductive connectors 100 are provided in a partial region (marked as A in the figures) of each original display panel 101 to be cut.

Figure 2A:
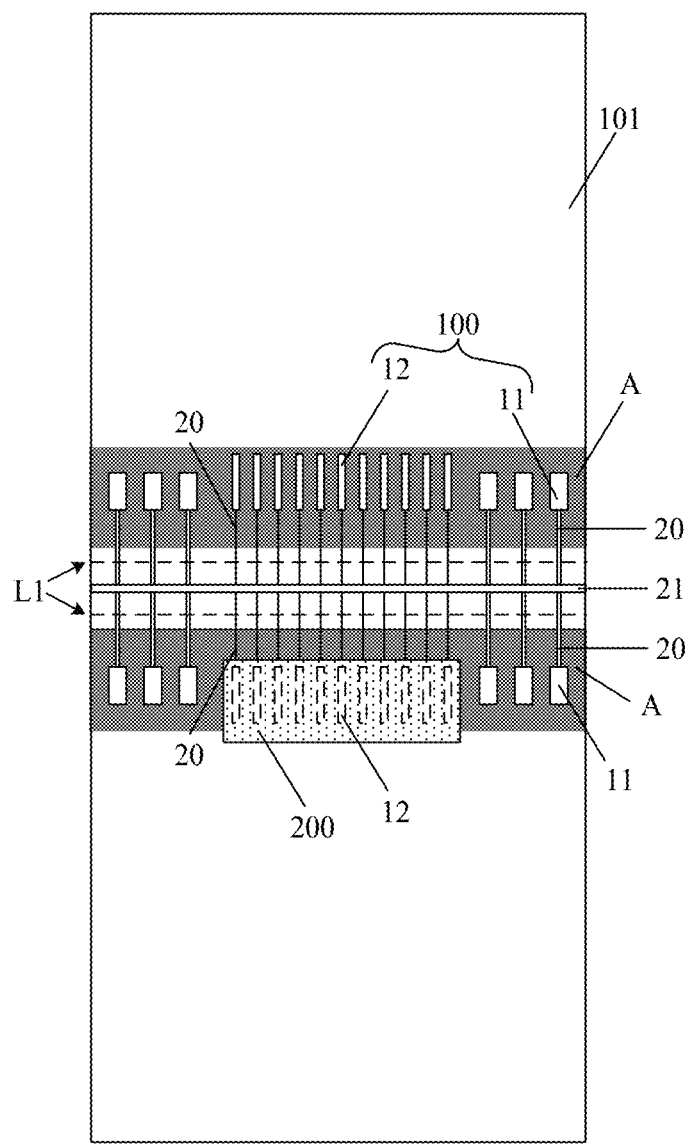
FIG. 2A is a schematic diagram showing a partial structure of a display motherboard and positions where the display motherboard is cut by using a first laser beam, in accordance with some embodiments.
Figure 2B:
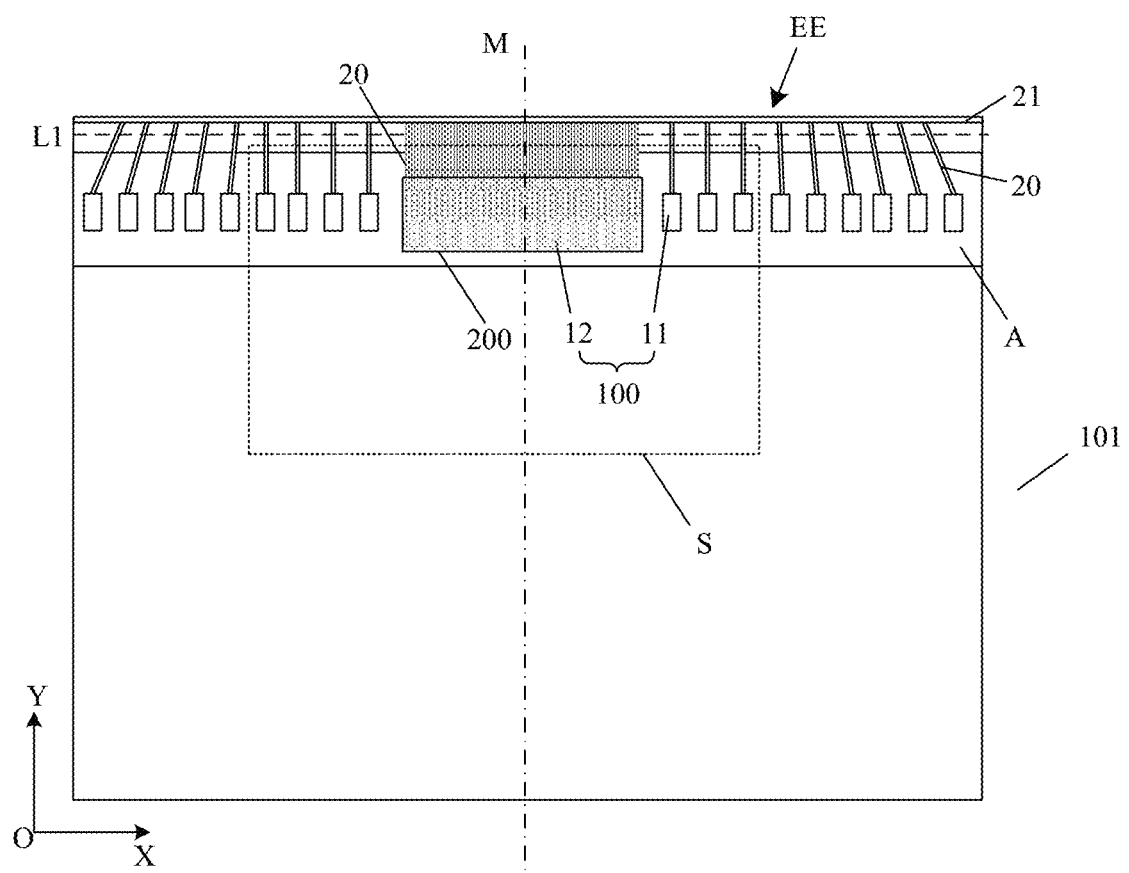
FIG. 2B is a schematic diagram showing a partial structure of another display motherboard and a position where the display motherboard is cut by using a first laser beam, in accordance with some embodiments.
Figure 3:
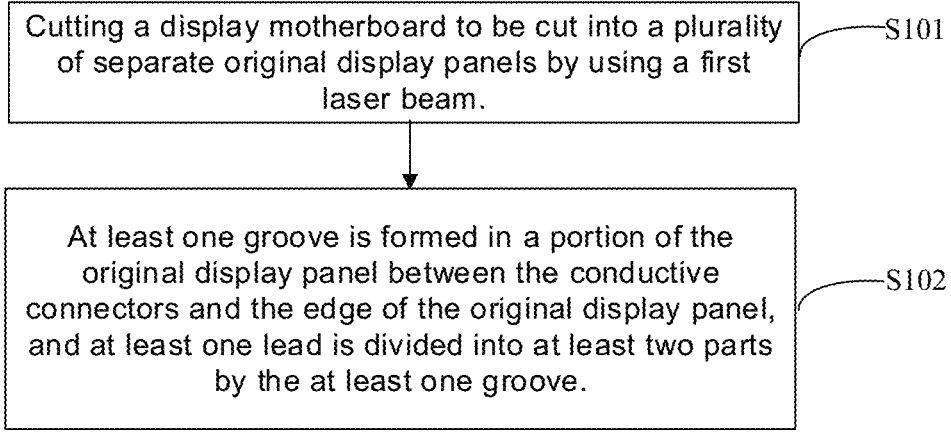
FIG. 3 is a flow diagram of a method for manufacturing a display panel, in accordance with some embodiments.

In some embodiments, as shown in FIGS. 2A and 2B, the conductive connectors 100 may include detection terminals 11 for electrical detection and bumps for bonding a circuit structure 200 such as a chip on flex (COF), and the bumps may be referred to as bonding electrodes 12 herein.

The bonding electrodes 12 and the detection terminals 11 are each connected to a lead 20. In some embodiments, the leads 20 are used for detecting the electrical performances of the display motherboard 01 before the display motherboard 01 is cut.

In addition, in the display motherboard 01, a bus 21 is provided between two adjacent original display panels 101 to be cut, so that leads 20 disposed on the two adjacent original display panels 101 to be cut may be electrically connected via the bus 21.

The COF is bonded to the bonding electrodes 12. During a detection process, detective signals are provided to the leads 20 via the bus 21. Then, probes are put onto and thus are in electrically contact with the detection terminals 11 and/or the bonding electrodes 12, so as to obtain detection signals. In this way, the detection of the electrical performances of the display motherboard 01 is implemented according to the obtained detection signals.

It will be noted that, the above embodiments are described by taking an example in which the conductive connectors 100 include the detection terminals 11 and the bonding electrodes 12. In some other embodiments, the conductive connectors 100 may include the detection terminals 11 and the circuit structure 200 such as the COF.

After the detection process is finished, the display motherboard 01 is cut to obtain a plurality of original display panels 101.

A method for manufacturing a display panel provided by some embodiments will be described in detail below. The method includes S101 and S102.

Figure 4:
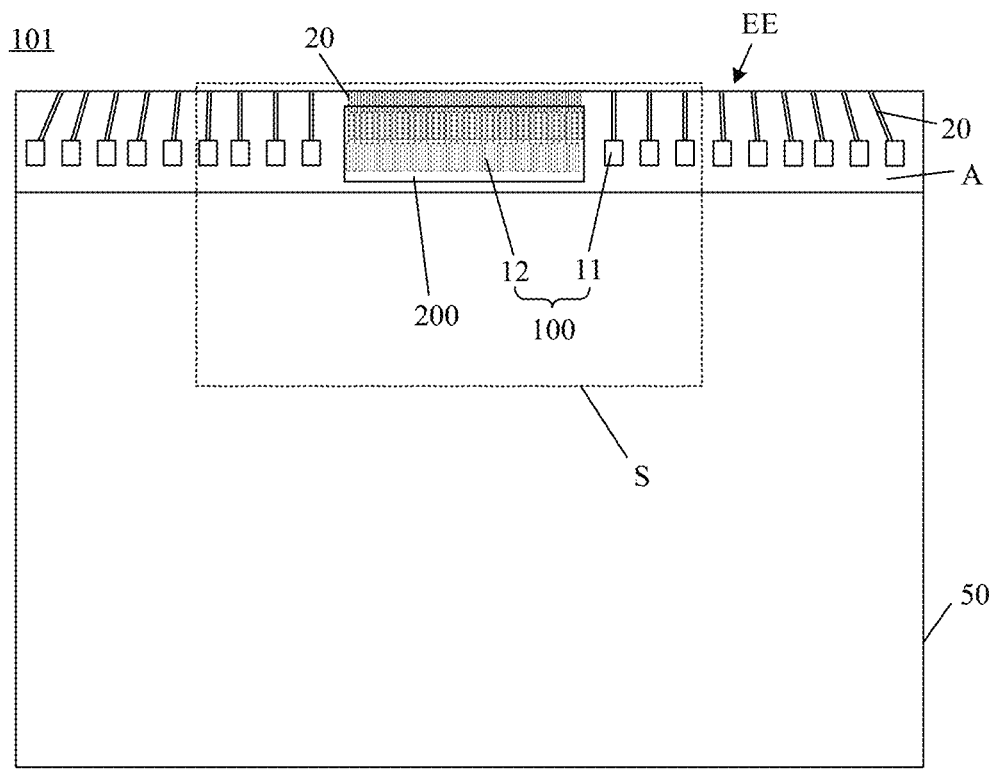
FIG. 4 is a schematic structural diagram of an original display panel, in accordance with some embodiments.
Figure 5:
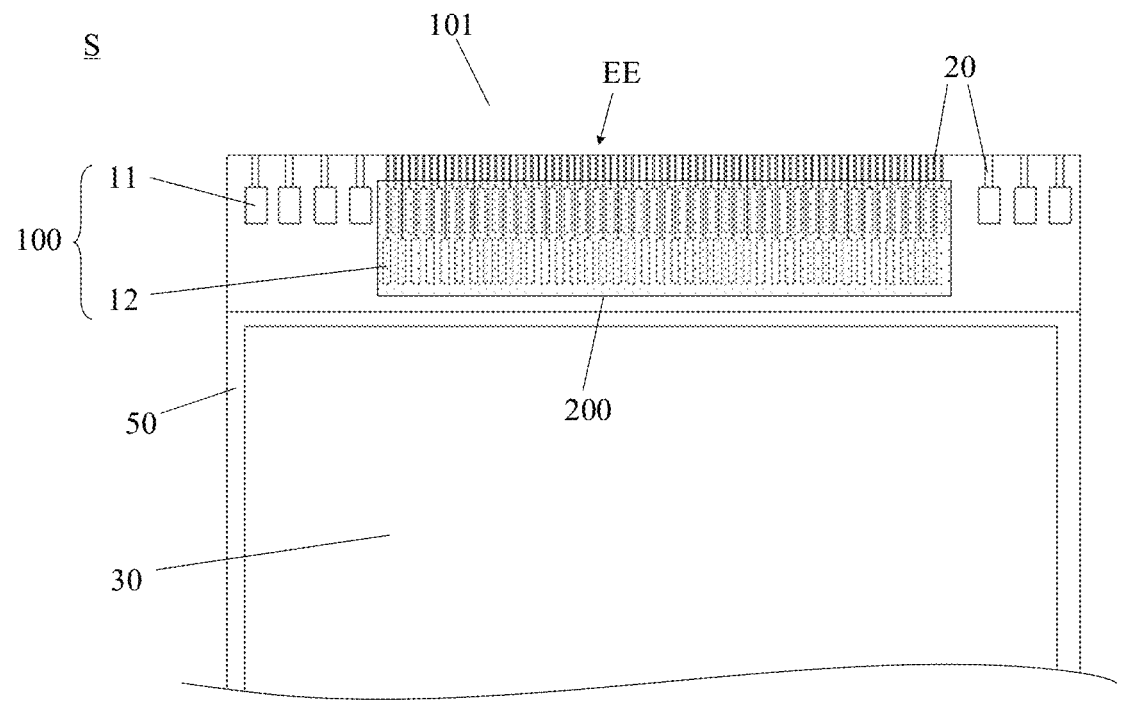
FIG. 5 is a schematic enlarged view of the region S in FIG. 4.

In S101, as shown in FIGS. 4 and 5, an original display panel 101 is provided. The original display panel 101 includes a base 50, and a plurality of conductive connectors 100 and a plurality of leads 20 that are formed on the base 50. One end of each lead 20 is connected to a corresponding conductive connector 100, and the other end of the lead 20 extends to an edge EE of the original display panel 101. Herein, the edge EE refers to an edge of the original display panel 101 along which the leads 20 and the conductive connectors 100 are arranged.

For example, as shown in FIGS. 1, 2A, 2B and 3, the S101 includes: cutting the display motherboard 01 to be cut into a plurality of separate original display panels 101 by using a first laser beam.

It will be noted that, for example, as shown in FIGS. 1, 2A and 2B, the display motherboard 01 may be provided with cutting paths L1 (shown by the dashed lines herein) thereon. In this case, the display motherboard 01 may be cut along the cutting paths L1 by using the first laser beam. As shown in FIG. 2B, the cutting path L1 of the display motherboard 01 may be substantially parallel to a first direction OX. In this case, the edge EE of the original display panel 101 formed after the display motherboard 01 is cut is substantially parallel to the first direction OX. For example, the first direction OX is substantially parallel to a direction in which the plurality of leads 20 and the conductive connectors 100 are arranged. That is, the edge EE of the original display panel 101 is substantially parallel to the direction in which the plurality of leads 20 and the conductive connectors 100 are arranged.

Since a manufacturing process of the display motherboard may include high-temperature processes, a base of the display motherboard is usually made of a relatively heat-resisting material. Accordingly, a relatively high-energy laser beam is required to cut the display motherboard. As a result, edges of the base the display motherboard may be melted when being subjected to the high-energy first laser beam. In addition, the leads 20 are severed during the cutting process with the first laser beam, and metal material of the leads 20 may be melted and welded together at positions where the leads 20 are severed during the cutting process. In other words, the leads 20 may be welded together after being melted by the first laser beam at the edge EE of the original display panel 101. In this way, in the original display panel 101 formed after the cutting process, adjacent leads 20 may be welded together at the edge EE of the original display panel 101, thereby resulting in short circuits of the leads 20 and display defects such as dark lines during a display process, which may reduce a cutting yield.

The first laser beam may be various laser beams with high energy that are used for cutting the display motherboard 01, as long as it is capable of cutting an entire display motherboard 01 into the plurality of original display panels 101. A type of the first laser beam is not limited herein.

In addition, a structure of the separate original display panel 101 formed after the cutting is shown in FIGS. 4 and 5. The original display panel 101 includes the base 50, and the conductive connectors 100 and the leads 20 that are disposed on the base 50. Of course, the original display panel 101 further includes a multilayer structure 30 located in an active area of the original display panel 101. The multilayer structure 30 may include a thin film transistor (TFT) array structure layer and a display layer (e.g., a liquid crystal layer or a light-emitting layer). In addition, in a case where the display panel is an organic light-emitting diode (OLED) display panel, the display panel 101 may further include some other layers such as a thin film encapsulation layer.

The conductive connector 100 is connected to the lead 20. One end of the lead 20 is connected to the conductive connector 100, and the other end thereof extends to the edge EE of the original display panel 101.

In this case, after S101, there may be at least one short-circuited lead 20 in the original display panel 101. Of course, there may not be the short-circuited leads 20 in the original display panel 101. The embodiments provided herein are suitable for the above two situations.

FIGS. 4 and 5 show a possible arrangement of the conductive connectors 100, and an exemplary number of the conductive connectors 100. A specific arrangement and the number of the conductive connectors 100 may be flexibly adjusted according to design parameters such as a size of the display panel. In addition, FIGS. 4 and 5 show an example in which the conductive connectors 100 include the detection terminals 11 and the bonding electrodes 12. The conductive connectors 100 may further include other conductive structures disposed in a Pad region of the display panel 101 outside the active area.

In S102, referring to FIGS. 3 and 6 to 13, at least one groove C is formed in a portion of the original display panel 101 between the conductive connectors 100 and the edge EE of the original display panel 101, and at least one lead 20 is divided into at least two parts by the at least one groove C, so as to form a display panel 102. Herein, a depth of the at least one groove C is greater than or equal to a thickness of each lead 20.

In some examples, the leads 20 in the original display panel 101 are all divided by the at least one groove C, which may ensure all short-circuited leads 20 included in the leads 20 are divided.

For example, in S102, the portion of the original display panel 101 between the conductive connectors 100 and the edge EE of the original display panel 101 is cut at least once by using a second laser beam (illustrated by the black arrow in FIG. 7), to form the at least one groove C.

Figure 6:
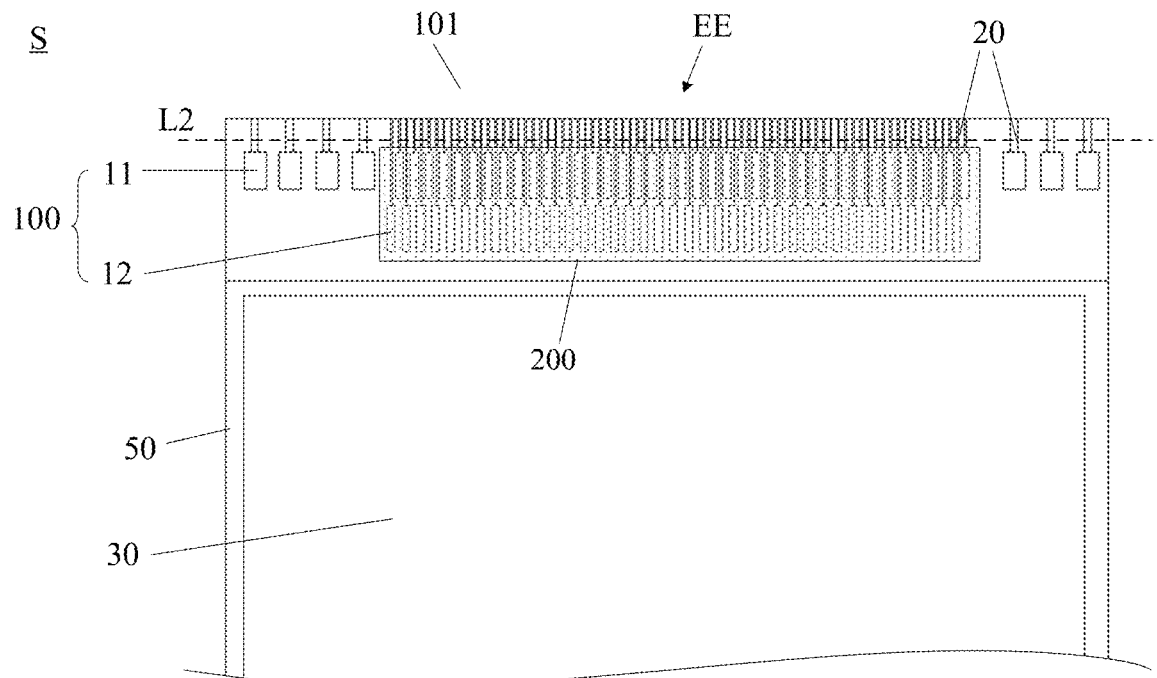
FIG. 6 is a schematic diagram showing a position where an original display panel is cut by using a second laser beam, in accordance with some embodiments.

Here, as shown in FIG. 6, a path along which the second laser beam moves to cut the original display panel 101 may be represented by a cutting path L2 (shown by the dashed line in FIG. 6).

For example, as shown in FIG. 6, the cutting path L2 of the second laser beam is substantially parallel to the edge EE of the original display panel 101. It will be noted that, there is at least one cutting path L2, and FIG. 6 shows an example in which there is only one cutting path L2.

In some embodiments, S102 may include forming the at least one groove C by using the second laser beam. That is to say, at least one lead 20 is severed at positions between the edge EE of the original display panel 101 and the conductive connectors 100. In this way, at least one short-circuited portion of the leads 20 and the conductive connectors 100 may be separated by the at least one groove C, so that they are electrically insulated, thereby avoiding display defects such as dark lines caused by short circuits of the display panel.

In some embodiments, during the cutting process, a laser for emitting the second laser beam may be moved from one end of the original display panel 101 to the other end of the original display panel 101, so that the severing positions of the leads 20 are on a same straight line, thereby simplifying a cutting process of the leads 20.

Figure 7:
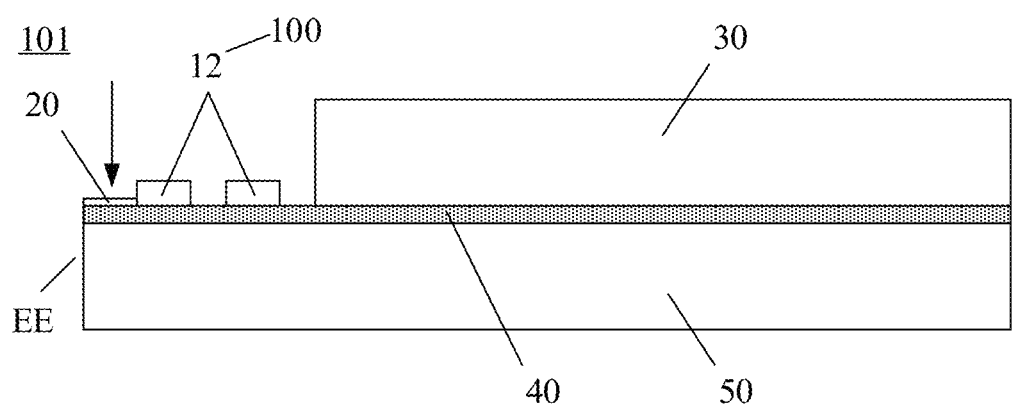
FIG. 7 is a schematic cross-section of an original display panel, in accordance with some embodiments.

In some embodiments, as shown in FIG. 7, the original display panel 101 further includes a base layer 40 disposed between the base 50 and the leads 20.

In some embodiments, by selecting appropriate cutting parameters of the cutting process, such as a power of the second laser beam, a cutting speed, and the number of times of the cutting, when the original display panel 101 is cut by using the second laser beam, only the leads 20 are severed, or the leads 20 are severed and a part of the base layer 40 under the leads 20 is cut, and other layers (e.g., the base 50) may not be cut. In this way, the short-circuited portions of the leads 20 and the conductive connectors 100 are separated to be electrically insulated, and since other layers may not be cut, any portions of the base 50 may not be melted during the cutting process using the second laser beam.

In some embodiments, the energy of the second laser beam is less than the energy of the first laser beam. The energy of the second laser beam is limited, and is only capable of substantially severing the leads 20 made of a metal material. Therefore, a melting degree of the base layer 40 under the leads 20 related to heat of the second laser beam is very low, and an amount of melting metal generated from the severed leads 20 is so small that the severed leads 20 may not be welded together to cause short-circuits again.

In summary, in the method for manufacturing the display panel provided by some embodiments, a trimming process for the leads 20 by using the second laser beam is applied to the original display panel 101 formed after the cutting by using the first laser beam, and the leads 20 are merely severed along the cutting path L2 substantially parallel to the edge EE (i.e., the first direction OX) by using the second laser beam. As a result, the short-circuited portions of the leads 20 and non-short-circuited portions of the leads 20 are separated and electrically insulated, which may improve display effect and product yield of the display panel 102.

In addition, in a case where a conductive connector 100 connected to one end of a lead 20 is a bonding electrode 12, since the leads 20 are usually arranged in the X direction, it is easy for the leads 20 which are short-circuited to bring a poor display in the X direction to the original display panel 101 formed after the cutting, that is, an undesirable phenomenon of X dark lines are easy to appear in the original display panel 101 formed after the cutting. By using the manufacturing method described above, the X dark lines caused by the short-circuits of the leads 20 may be decreased or further eliminated, thereby improving the undesirable phenomenon of the X dark lines and further improving the display quality of the display panel.

In some embodiments, the display motherboard 01 is a flexible display motherboard, the original display panels 101 formed after the cutting are flexible display panels, and a base of the flexible display motherboard is usually a polyimide (PI) film and/or a polyethylene terephthalate (PET) film. In other words, the base 50 of the original display panels 101 is melted more seriously at the edge EE after being subjected to the high-energy first laser beam, and it is more likely to cause adjacent leads 20 at the severing positions to be welded together to be short-circuited. However, through the method for manufacturing the display panel described above, the leads 20 that are welded together may be severed, and the short circuits of the leads 20 may be avoided, thereby improving a yield of the flexible display panels.

The flexible display panels may include the multilayer structure 30 described above, and the display layer in the multilayer structure 30 may be a light-emitting layer or an organic light-emitting layer.

Figure 9:
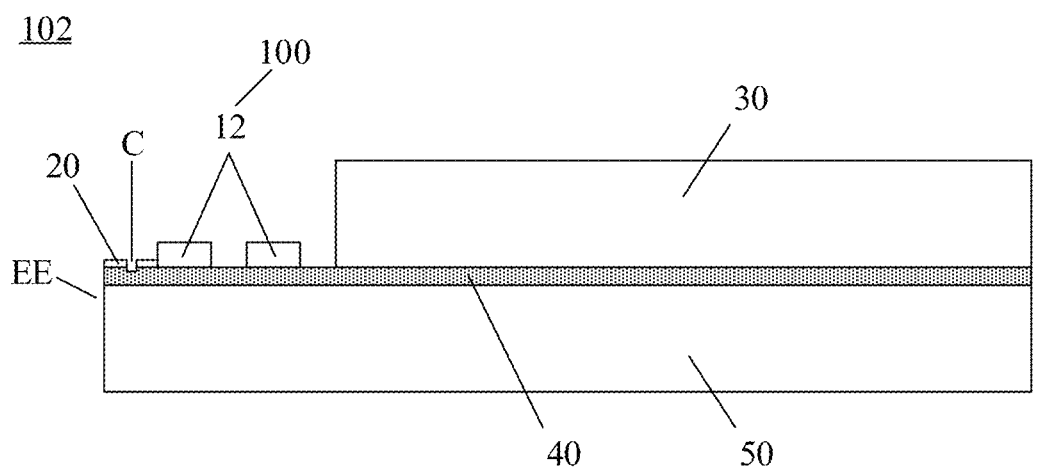
FIG. 9 is a schematic cross-section of a display panel, in accordance with some embodiments.
Figure 12:
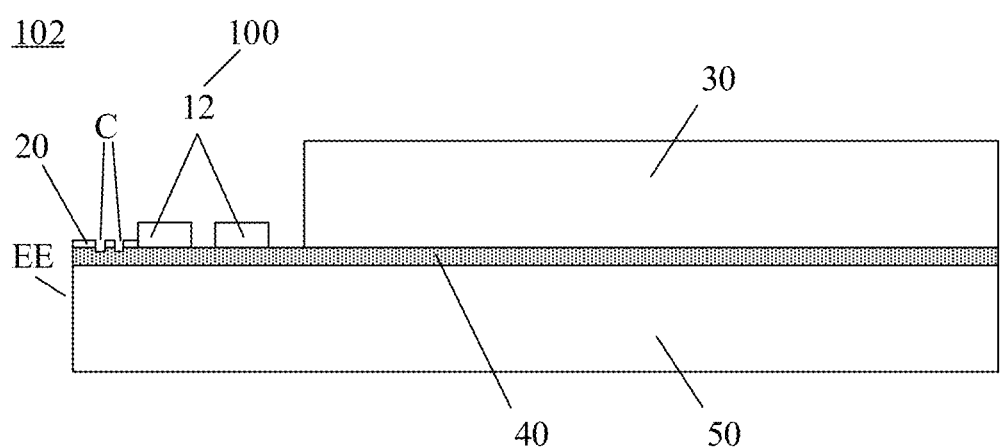
FIG. 12 is a schematic cross-section of another display panel, in accordance with some embodiments.

Referring to FIGS. 7, 9 and 12, the conductive connectors 100 and the leads 20 may be formed on a surface of the base layer 40 facing away from the base 50. In order to reduce a process error in the cutting process by using the second laser beam, a cutting depth of the second laser beam may be allowed to be increased, for example, the groove C may extend slightly downward. In other words, a range of the cutting depth may be increased, which may allow to enlarge an adjustment range of the parameters of the second laser beam. It will be understood that the cutting depth of the second laser beam is equal to a depth of the groove C formed by the second laser beam.

In some embodiments, the groove C passes through a portion of the base layer 40, and there is a distance (greater than 0 μm) between a bottom of the groove C and a surface of the base layer 40 adjacent to the base 50.

It will be noted that, in FIGS. 7, 9 and 12, the above "downward" direction refers to a direction pointing from a lead 20 to the base layer 40.

The parameters of the second laser beam need to satisfy the following conditions. The cutting depth of the second laser beam is greater than or equal to the thickness of the lead 20 and is less than a sum of the thickness of the lead 20 and a thickness of the base layer 40. In this way, the cutting depth of the second laser beam only needs to be greater than or equal to the thickness of the lead 20 to ensure that each short-circuited lead 20 is divided into a short-circuited portion and a non-short-circuited portion, thereby avoiding severing the base layer 40 while ensuring that the lead 20 is severed by using the second laser beam.

It will be noted that, the "thickness" of the lead 20 described above is a minimum distance from a surface of the lead 20 away from the base layer 40 to a surface of the base layer 40.

In some embodiments, the thickness of the lead 20 made of the metal material may range from 1 μm to 2 μm. In a case where the thickness of the lead 20 is less than 1 μm, a process accuracy needs to be increased, which is not conducive to reducing costs of the product. In a case where the thickness of the lead 20 is greater than 2 μm, a thickness of the display panel 101 is increased, which is not conducive to an ultra-thin design trend of the display panel.

In some examples, the thickness of the lead 20 may be 1.3 μm, 1.5 μm, 1.8 μm, or 2 μm. In this case, setting of the parameters of the second laser beam makes the cutting depth thereof greater than the above 1 μm to 2 μm and extend slightly downward, so as to ensure that each lead 20 is completely segmented.

In some embodiments, the original display panel 101 and the display panel 102 are flexible display panels, and the base layer 40 is a flexible organic layer, which is made of, for example, PI (Polyimide). Since a texture of the base layer 40 is soft, in order to facilitate to form the multilayer structure 30 above the base layer 40, a PET (Polyethylene terephthalate) base 50 with a thickness greater than the thickness of the base layer 40 is provided under the base layer 40 to provide support. Here, PET has a relatively great surface hardness, so it can provide support to the base layer 40.

In some embodiments, according to output manners of laser beams, the laser beams may be classified into a continuous laser beam with a continuous output, and a pulsed laser beam with a discontinuous output.

Therefore, in some embodiments, the second laser beam may be the pulsed laser beam, and may be, for example, a green laser beam or an ultraviolet (UV) laser beam. An output of the pulsed laser beam is discontinuous. The pulsed laser beam may have a higher control precision. In addition, more importantly, a cutting manner of the pulsed laser beam is a manner of breaking a molecular structure, which can reduce heat input to the material to be cut to the minimum, and energy provided to the material to be cut is very low. Therefore, the pulsed laser beam may perform a processing with a high cutting quality and a good dimensional accuracy. The shorter a pulse width of the pulsed laser beam is, the smaller a thermal effect it has. In a case where the above cutting manner is applied to the trimming process of the leads 20 in the flexible display panel 101, a secondary melting phenomenon of film layers in the display panel 102 may not occur, and a trimming yield of the short-circuited leads may further be improved.

A wavelength of the green laser beam may be approximately 515 nm and/or 532 nm, and a wavelength of the UV laser beam may be 355 nm. The green laser beam and the UV laser beam may have smaller wavelengths and greater laser energy, and have advantages of smaller laser spots and more concentrated energies after focusing.

In some embodiments, the pulsed laser beam used as the second laser beam may be a picosecond pulsed laser beam with a higher accuracy.

A width of the picosecond pulse may be compared with an electro-optical relaxation time, and is short enough to make the picosecond pulsed laser beam perform a cold ablation on the material to be cut and not generate a hot melting, thereby further ensuring that the adjacent leads 20 are not welded together again after the cutting by using the second laser beam, which makes a segmented cutting accuracy of the leads 20 higher.

The picosecond pulsed laser beam may be a picosecond green laser beam or a picosecond UV laser beam.

Some embodiments of the present disclosure provide a display panel. Referring to FIGS. 8A to 13, the display panel 102 includes a base 50, a plurality of conductive connectors 100, a plurality of leads 20 and at least one groove C. One end of the lead 20 is connected to a corresponding conductive connector 100, and the other end thereof extends to an edge EE of the display panel 102. The at least one groove C is disposed between the conductive connectors 100 and the edge EE of the display panel 102. At least one lead 20 is divided into at least two parts by the at least one groove C, and a depth of the groove C is greater than or equal to a thickness of the lead 20.

Herein, the edge EE of the display panel 102 is an edge of the display panel 102 along which the leads 20 are arranged. It will be understood that the edge EE of the display panel 102 is the edge EE of the original display panel 101 formed after the cutting by using the first laser beam.

In the display panel 102, at least one groove C is formed between the edge EE and the conductive connectors 100, and the at least one groove C may divide at least one lead 20, such as each lead 20, into a short-circuited portion and a non-short-circuited portion. In this way, the short-circuited portions of the leads 20 and the conductive connectors 100 may be separated by the at least one groove C, so that the two are electrically insulated, thereby avoiding the display defects such as the dark lines caused by the short circuit of the display panel.

The thickness of the lead 20 may range from 0.02 μm to 2 μm, such as range from 1 μm to 2 μm. For example, the thickness of the lead 20 may be 0.05 μm, 0.08 μm, 0.09 μm, 1.25 μm, 1.4 μm, 1.5 μm, 1.8 μm or 1.9 μm.

In some embodiments, the depth of the groove C ranges from 5 μm to 13 μm. For example, the depth of the groove C may be 5 μm, 7 μm, 10 μm, 12 μm or 13 μm.

It will be noted that, the extending directions of the leads 20 may be or not be parallel to each other.

Figure 8A:
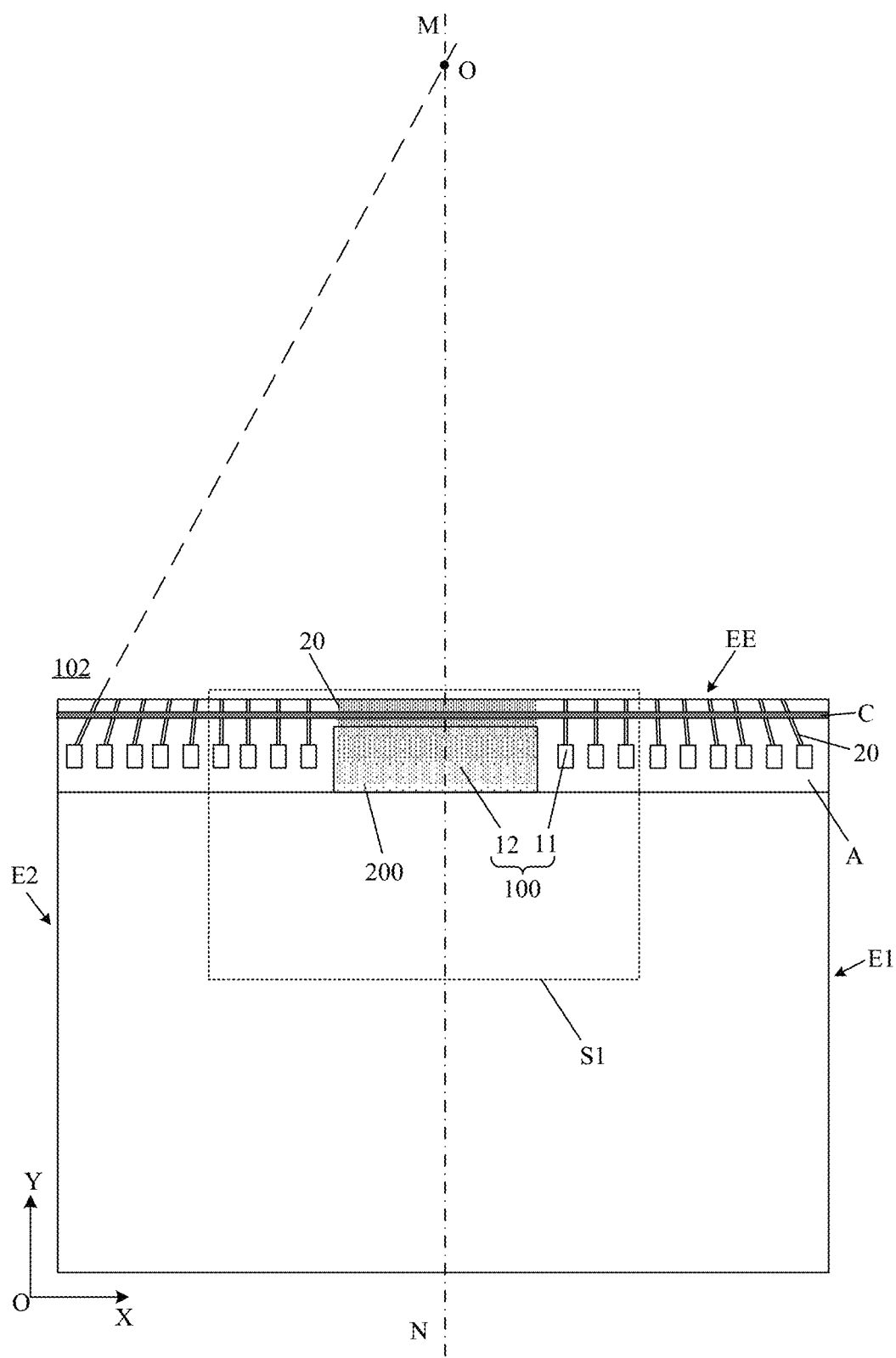
FIG. 8A is a schematic top view of a display panel, in accordance with some embodiments.
Figure 8B:
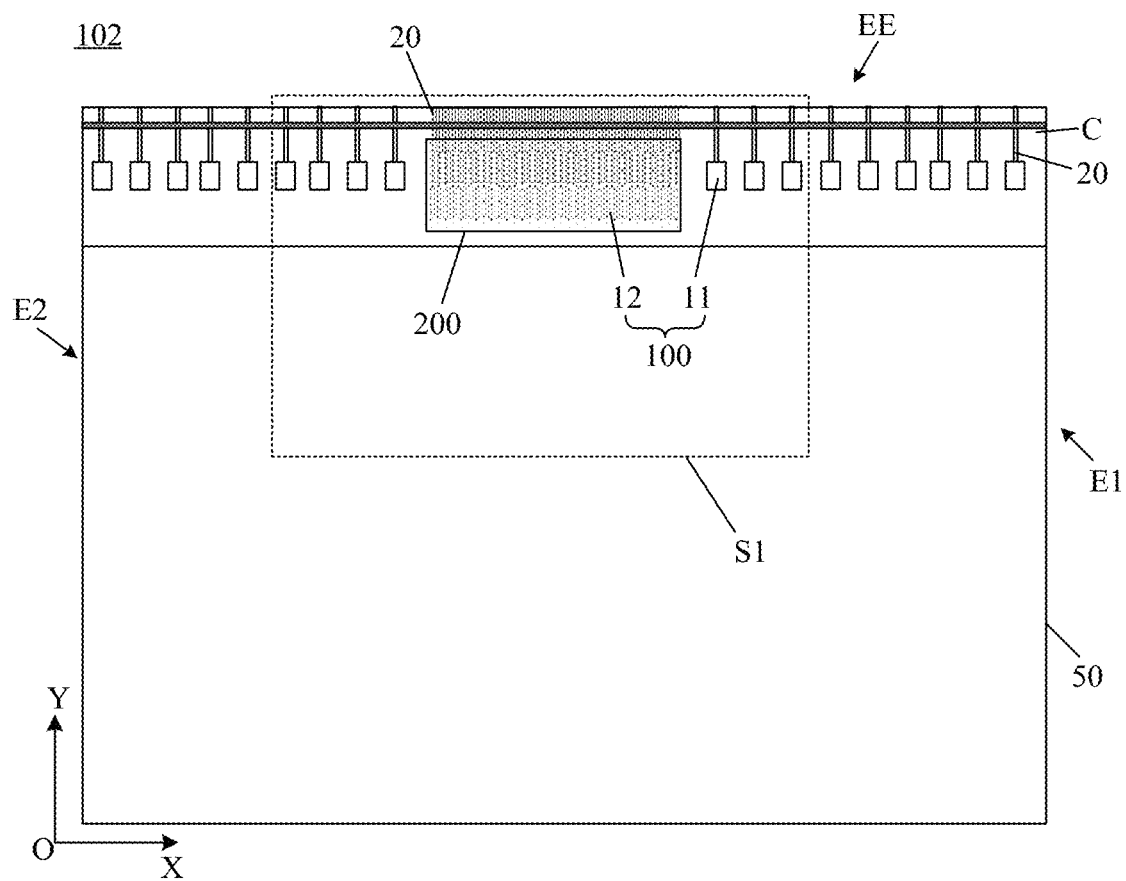
FIG. 8B is a schematic top view of another display panel, in accordance with some embodiments.
Figure 8C:
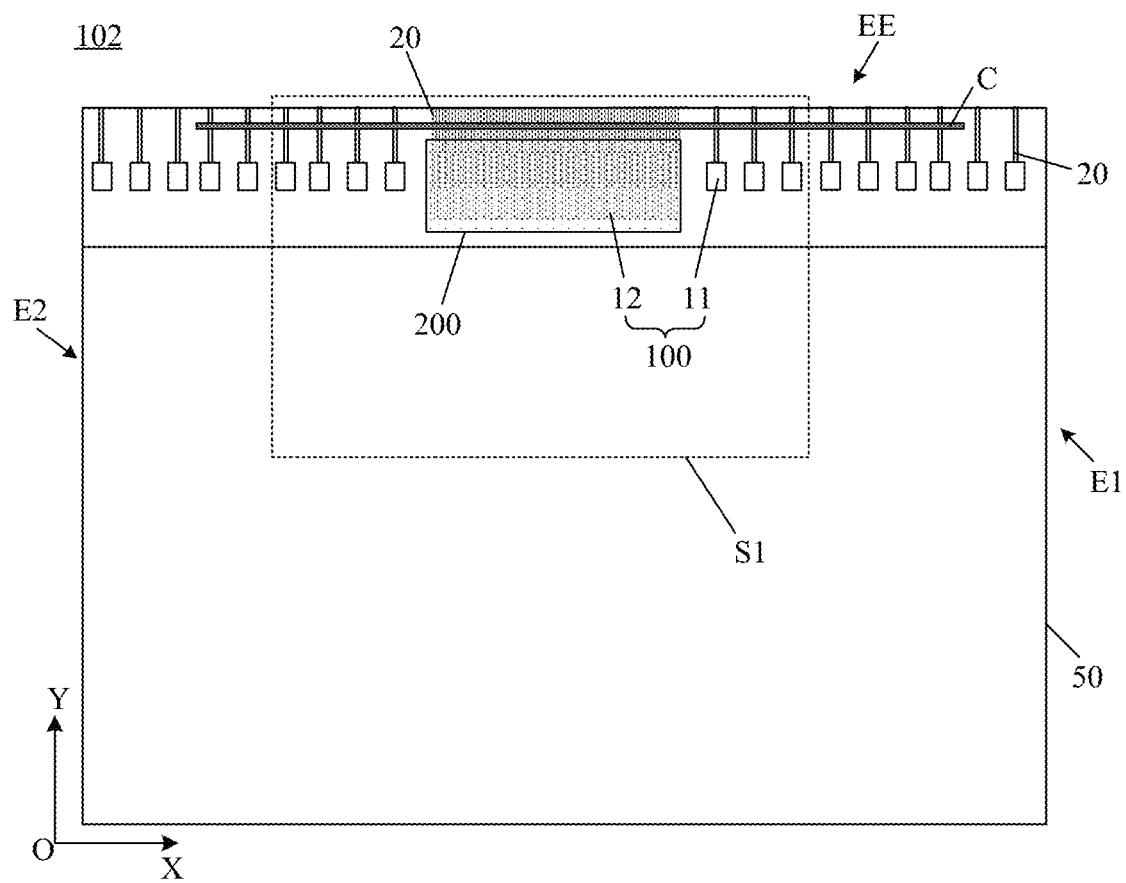
FIG. 8C is a schematic top view of yet another display panel, in accordance with some embodiments.

For example, as shown in FIGS. 8B and 8C, the extending directions of the leads 20 may be substantially parallel to each other, and the extending directions of the leads 20 are substantially perpendicular to the edge EE of the display panel 102.

For another example, as shown in FIG. 8A, extending directions of leads 20 proximate to a central axis MN of the display panel 102 are substantially parallel to each other, and the extending directions are substantially parallel to a second direction OY, which is substantially perpendicular to the first direction OX herein. Extending lines of leads 20 away from the central axis MN (i.e., leads 20 proximate to edges E1 and E2 which are respectively located on two different sides of the central axis MN of the display panel 102) intersect with the central axis MN, and a point O where an extension line of each lead 20 intersects with the central axis MN is located on a side of the edge EE away from the display panel 102. In this case, the extending lines of the leads 20 intersect with the edge EE and are not perpendicular to the edge EE. It will be understood that, the central axis MN is a central axis of a surface of the display panel 102 where the plurality of leads 20 and the plurality of conductive connectors 100 of the display panel 102 are located, and the central axis MN of the display panel 102 intersects with the edge EE.

In some embodiments, the edge EE of the display panel 102 is formed after the cutting by using the first laser beam, each groove C is formed after the cutting at least once by using the second laser beam, and the energy of the second laser beam is less than the energy of the first laser beam. Herein, referring to FIGS. 1, 2A and 2B, a manufacturing process of the display panel 102 may further includes cutting the display motherboard 01. As for the cutting process of the display motherboard 01, reference may be made to the above description of the method for manufacturing the display panel, and details will not be repeated herein.

In some embodiments, the second laser beam is a pulsed laser beam, such as a picosecond green laser beam or a picosecond UV laser beam. For example, the second laser beam may be a picosecond green laser beam with a wavelength of 515 nm or a picosecond UV laser beam with a wavelength of 343 nm.

For example, the at least one groove C is formed after cutting twice by using the picosecond green laser beam, a power of the picosecond green laser beam ranges from 1.5 W to 3.5 W, and a cutting speed ranges from 1200 mm/s to 1800 mm/s. For example, the power of the picosecond green laser beam is 1.5 W, 1.8 W, 2 W, 2.4 W, 2.8 W, 3.2 W or 3.5 W. For example, the cutting speed is 1200 mm/s, 1300 mm/s, 1450 mm/s, 1500 mm/s, 1600 mm/s, 1700 mm/s or 1800 mm/s.

Figure 10:
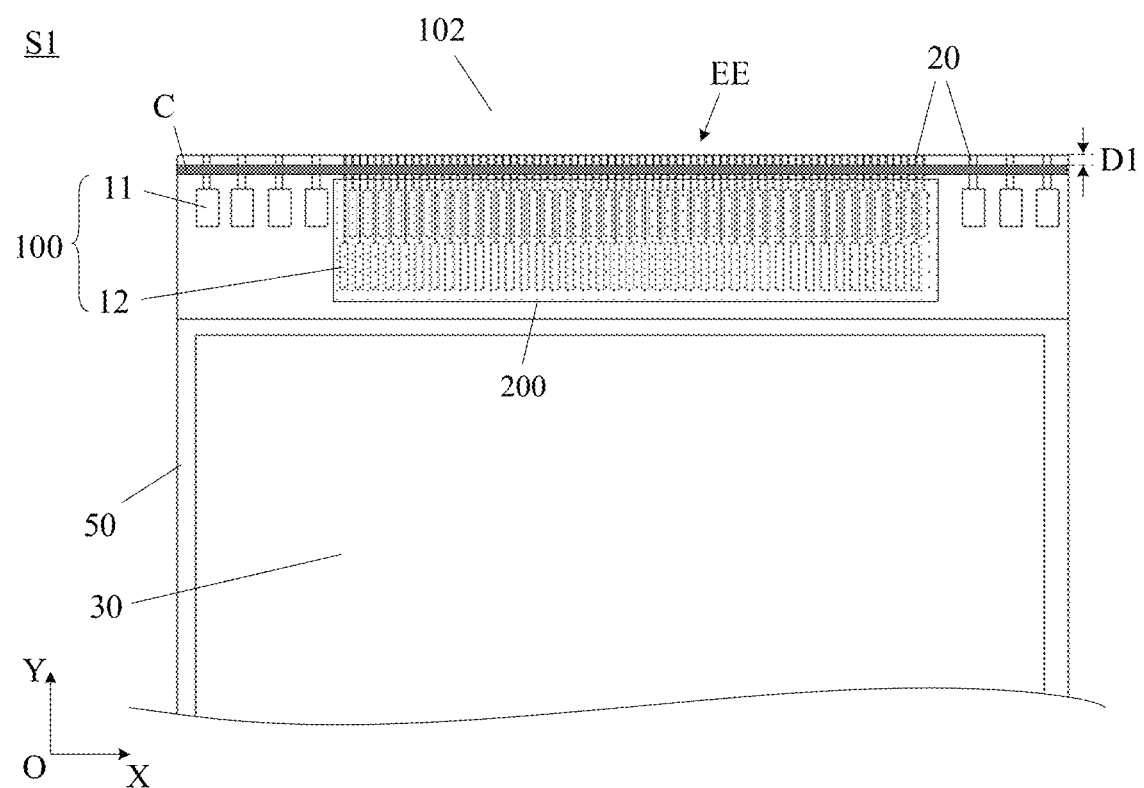
FIG. 10 is a schematic enlarged view of the region S1 in FIGS. 8A, 8B and 8C, in accordance with some embodiments.
Figure 13:
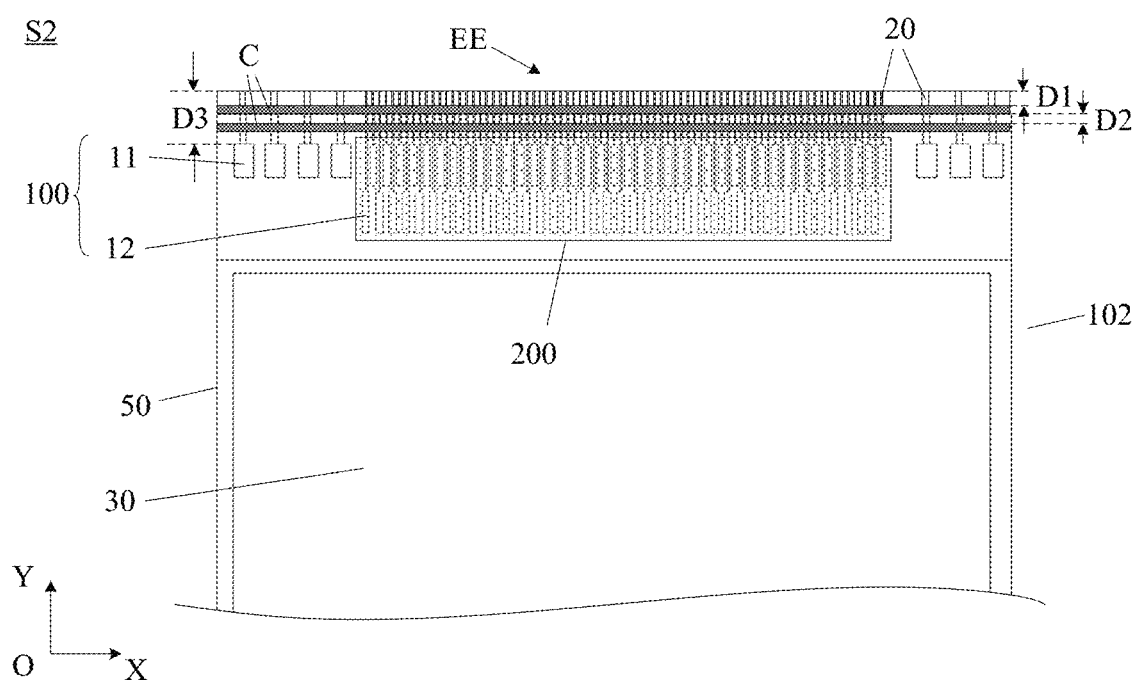
FIG. 13 is a schematic enlarged view of the region S2 in FIGS. 11A and 11B, in accordance with some embodiments.

In some embodiments, as shown in FIGS. 10 and 13, in the at least one groove C, an extending direction of a groove C closest to the edge EE of the display panel 102 is substantially parallel to the edge EE, and a minimum distance D1 between the groove C closest to the edge EE and the edge EE is greater than or equal to 30 μm, and is less than 200 μm. For example, the distance D1 between the groove C closest to the edge EE and the edge EE is approximately 30 μm, 50 μm, 63.4 μm, 80 μm, 100 μm, 115 μm, 130 μm, 150 μm, 180 μm or 200 μm.

In addition, the minimum distance D1 between the groove C closest to the edge EE and the edge EE refers to a minimum distance between a side wall of the groove C proximate to the edge EE and the edge EE.

For example, as shown in FIG. 10, the display panel 102 includes only one groove C, the minimum distance D1 between the groove C and the edge EE is greater than or equal to 30 µm, and is less than 200 µm, such as 30 µm, 50 µm, 65 µm, 80 µm, 100 µm, 115 µm, 130 µm, 150 µm, 180 µm or 198 µm.

Figure 11A:
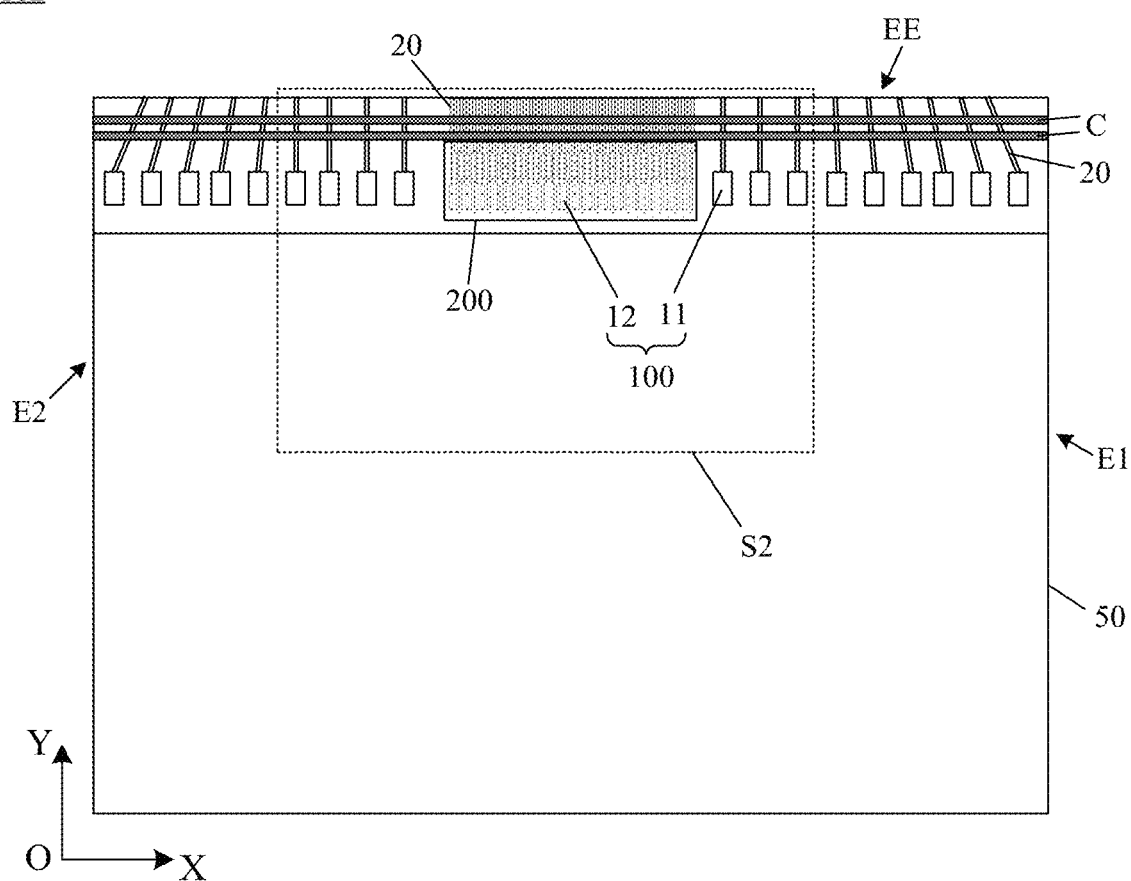
FIG. 11A is a schematic top view of yet another display panel, in accordance with some embodiments.
Figure 11B:
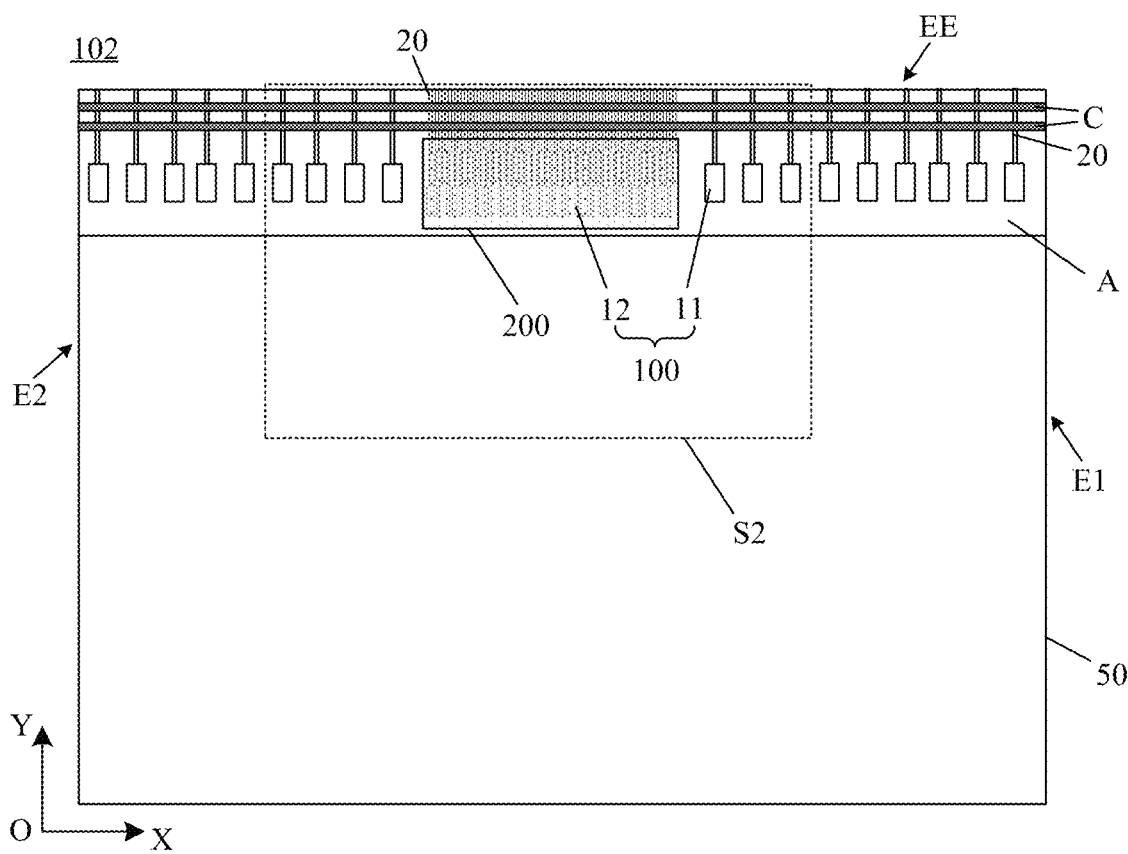
FIG. 11B is a schematic top view of yet another display panel, in accordance with some embodiments.

In some embodiments, as shown in FIGS. 11A, 11B and 12, the display panel 102 includes at least two grooves C. As shown in FIG. 13, extending directions of any two adjacent grooves C are substantially parallel to each other, and a minimum distance D2 between two adjacent side walls of the two adjacent grooves C is greater than or equal to 30 µm and is less than 200 µm.

In some embodiments, a width of each groove C is less than 25 µm and is greater than 0 µm, such as 5 µm, 8 µm, 12 µm, 15 µm, 20 µm, 23 µm or 24 µm. Herein, the width of the groove C refers to a dimension of the groove C in a direction perpendicular to an extending direction thereof.

For example, the width of each groove is approximately 18.2 µm.

In some embodiments, referring to FIG. 13, an edge of the conductive connector 100 proximate to the edge EE of the display panel 102 is substantially parallel to the edge EE, and a minimum distance D3 between the edge of the conductive connector 100 proximate to the edge EE and the edge EE ranges from 100 µm to 200 µm. For example, the distance D3 is approximately 100 µm, 115 µm, 130 µm, 150 µm, 166.3 µm, 180 µm or 198 µm.

Some embodiments of the present disclosure provide a display device, which includes the display panel 102 provided by any one of the foregoing embodiments. The display device has same technical effects as the display panel 102, and details will not be repeated herein.

The display device may be any product or component having a display function such as a display, a television, a digital photo frame, a mobile phone, a tablet computer or a navigator.

In some embodiments, the display panel is a flexible OLED display panel, and the display device is a flexible OLED display device. In some embodiments, the display device is a wearable OLED display device, such as a smart bracelet or a smart watch.

The above descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display panel, comprising:
    a base;
    a plurality of conductive connectors disposed on the base;
    a plurality of leads arranged on the base along an edge of the display panel, one end of each lead of the plurality of leads being connected to a corresponding conductive connector, and another end of the lead of the plurality of leads extending to the edge of the display panel; and
    at least one groove located between the plurality of conductive connectors and the edge of the display panel; at least one lead of the plurality of leads being divided into at least two parts by the at least one groove, and a depth of the at least one groove being greater than or equal to a thickness of the at least one lead of the plurality of leads respectively.

2. The display panel according to claim 1, wherein an extending direction of a groove closest to the edge of the display panel in the at least one groove is substantially parallel to the edge of the display panel, and a minimum distance between the groove closest to the edge of the display panel and the edge of the display panel is greater than or equal to 30 µm and is less than 200 µm.

3. The display panel according to claim 2, wherein the minimum distance between the groove closest to the edge of the display panel and the edge of the display panel is approximately 63.4 µm.

4. The display panel according to claim 1, wherein the at least one groove includes at least two grooves, extending directions of any two adjacent grooves are substantially parallel to each other, and a minimum distance between two adjacent side walls of the two adjacent grooves is greater than or equal to 30 µm and is less than 200 µm.

5. The display panel according to claim 1, wherein a width of each groove of the at least one groove in a direction perpendicular to an extending direction of the groove is less than 25 µm and is greater than 0 µm.

6. The display panel according to claim 5, wherein the width of each groove of the at least one groove is approximately 18.2 µm.

7. The display panel according to claim 1, wherein an edge of each of the plurality of conductive connectors proximate to the edge of the display panel is substantially parallel to the edge of the display panel, and a minimum distance between the edge of each of the plurality of conductive connectors proximate to the edge of the display panel and the edge of the display panel ranges from 100 µm to 200 µm.

8. The display panel according to claim 7, wherein the minimum distance between the edge of each of the plurality of conductive connectors proximate to the edge of the display panel and the edge of the display panel is approximately 166.3 µm.

9. The display panel according to claim 1, further comprising a base layer disposed between the base and a group including all the plurality of leads and the plurality of conductive connectors, and
    the depth of the at least one groove being respectively less than a sum of the thickness of the at least one lead of the plurality of leads and a thickness of the base layer.

10. The display panel according to claim 1, wherein extending directions of the plurality of leads are substantially parallel to each other, and are substantially perpendicular to the edge of the display panel.

11. The display panel according to claim 1, wherein in the plurality of leads, extending lines of two or more leads closer to a central axis of the display panel are substantially parallel to each other; extending lines of two or more leads farther away from the central axis intersect, and points where the extending lines of the two or more leads of the plurality of leads away from the central axis intersect with the central axis is located on a side of the edge of the display panel away from the display panel; and the central axis intersects with the edge of the display panel.

12. The display panel according to claim 1, wherein the display panel is a flexible display panel.

13. The display panel according to claim 1, wherein the plurality of conductive connectors include bonding electrodes for bonding a circuit structure and/or detection terminals for electrical detection.

14. The display panel according to claim 1, wherein thicknesses of the plurality of leads range from 1 μm to 2 μm.

15. A display device, comprising the display panel according to claim 1.

16. A method for manufacturing a display panel, the method comprising:
cutting a display motherboard by using a first laser beam to form an original display panel, wherein the original display panel includes a base, a plurality of conductive connectors formed on the base, and a plurality of leads formed on the base along an edge of the original display pane, one end of each lead of the plurality of leads is connected to a corresponding conductive connector, and another end of the lead of the plurality of leads extends to the edge of the original display panel; and
cutting a portion of the original display panel between the plurality of conductive connectors and the edge of the original display panel by using a second laser beam to form at least one groove, wherein at least one lead of the plurality of leads is divided into at least two parts by the at least one groove, and a depth of the at least one groove is greater than or equal to a thickness of the at least one lead of the plurality of leads respectively; each groove of the at least one groove is formed after being cut at least once by using the second laser beam.

17. The method according to claim 16, wherein energy of the second laser beam is less than energy of the first laser beam.

18. The method according to claim 16, wherein the second laser beam is a pulsed laser beam.

19. The method according to claim 18, wherein the pulsed laser beam is a picosecond green laser beam or a picosecond ultraviolet laser beam.

20. The method according to claim 19, wherein the at least one groove is formed after being cut twice by using the picosecond green laser beam, a power of the picosecond green laser beam ranges from 1.5 W to 3.5 W, and a cutting speed ranges from 1200 mm/s to 1800 mm/s.

* * * * *